(12) United States Patent
Jung et al.

(10) Patent No.: US 8,993,054 B2
(45) Date of Patent: Mar. 31, 2015

(54) METHOD AND SYSTEM TO REDUCE OUTGASSING IN A REACTION CHAMBER

(71) Applicant: ASM IP Holding B.V., Almere (NL)

(72) Inventors: Sung-Hoon Jung, Chandler, AZ (US); Petri Raisanen, Gilbert, AZ (US); Eric Jen Cheng Liu, Tempe, AZ (US); Mike Schmotzer, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/941,134

(22) Filed: Jul. 12, 2013

(65) Prior Publication Data

US 2015/0017319 A1 Jan. 15, 2015

(51) Int. Cl.
  *C23C 16/00* (2006.01)
  *C23C 16/44* (2006.01)
  *C23C 16/455* (2006.01)

(52) U.S. Cl.
  CPC ....... *C23C 16/4404* (2013.01); *C23C 16/45525* (2013.01); *C23C 16/45534* (2013.01)
  USPC .................................................... 427/248.1

(58) Field of Classification Search
  None
  See application file for complete search history.

(56) References Cited

U.S. PATENT DOCUMENTS

| 2,745,640 A | 5/1956 | Cushman |
| 2,990,045 A | 9/1959 | Root |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,058,430 A | 11/1977 | Suntola et al. |
| 4,176,630 A | 12/1979 | Elmer |
| 4,194,536 A | 3/1980 | Stine et al. |
| 4,389,973 A | 6/1983 | Suntola et al. |
| 4,393,013 A | 7/1983 | McMenamin |
| 4,436,674 A | 3/1984 | McMenamin |
| 4,570,328 A | 2/1986 | Price et al. |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,827,430 A | 5/1989 | Aid et al. |

(Continued)

FOREIGN PATENT DOCUMENTS

| CN | 1563483 | 1/2005 |
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — Joseph Miller, Jr.
(74) *Attorney, Agent, or Firm* — Snell & Wilmer LLP (57) ABSTRACT

Systems and methods of reducing outgassing of a substance within a reaction chamber of a reactor are disclosed. Exemplary methods include depositing a barrier layer within the reaction chamber and using a scavenging precursor to react with species on a surface of the reaction chamber. Exemplary systems include gas-phase deposition systems, such as atomic layer deposition systems, which include a barrier layer source and/or a scavenging precursor source fluidly coupled to a reaction chamber of the system.

11 Claims, 8 Drawing Sheets

(56) References Cited

U.S. PATENT DOCUMENTS

| | | |
|---|---|---|
| 4,991,614 A | 2/1991 | Hammel |
| 5,062,386 A | 11/1991 | Christensen |
| 5,119,760 A | 6/1992 | McMillan et al. |
| 5,167,716 A | 12/1992 | Boitnott et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,326,427 A | 7/1994 | Jerbic |
| 5,380,367 A | 1/1995 | Bertone |
| 5,595,606 A | 1/1997 | Fujikawa et al. |
| 5,632,919 A | 5/1997 | MacCracken et al. |
| 5,730,801 A | 3/1998 | Tepman |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,855,680 A | 1/1999 | Soininen et al. |
| 5,979,506 A | 11/1999 | Aarseth |
| 6,013,553 A | 1/2000 | Wallace |
| 6,015,465 A | 1/2000 | Kholodenko et al. |
| 6,060,691 A | 5/2000 | Minami et al. |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,161,500 A | 12/2000 | Kopacz et al. |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,569,239 B2 | 5/2003 | Arai et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,648,974 B1 | 11/2003 | Ogliari et al. |
| 6,682,973 B1 | 1/2004 | Paton et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,547 B2 | 2/2005 | Metzner |
| 6,863,019 B2 | 3/2005 | Shamouilian |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,437,060 B2 | 10/2008 | Wang et al. |
| 7,442,275 B2 | 10/2008 | Cowans |
| 7,489,389 B2 | 2/2009 | Shibazaki |
| 7,547,363 B2 | 6/2009 | Tomiyasu et al. |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| 7,651,583 B2 | 1/2010 | Kent et al. |
| D614,153 S | 4/2010 | Fondurulia et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,851,019 B2 | 12/2010 | Tuominen et al. |
| 7,884,918 B2 | 2/2011 | Hattori |
| 8,041,197 B2 | 10/2011 | Kasai et al. |
| 8,071,451 B2 | 12/2011 | Berry |
| 8,071,452 B2 | 12/2011 | Raisanen |
| 8,072,578 B2 | 12/2011 | Yasuda |
| 8,076,230 B2 | 12/2011 | Wei |
| 8,076,237 B2 | 12/2011 | Uzoh |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,216,380 B2 | 7/2012 | White et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,309,173 B2 | 11/2012 | Tuominen et al. |
| 8,367,528 B2 | 2/2013 | Bauer et al. |
| 8,444,120 B2 | 5/2013 | Gregg et al. |
| 8,608,885 B2 | 12/2013 | Goto et al. |
| 8,683,943 B2 | 4/2014 | Onodera et al. |
| 8,711,338 B2 | 4/2014 | Liu et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| 8,877,655 B2 | 11/2014 | Shero et al. |
| 8,883,270 B2 | 11/2014 | Shero et al. |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0111963 A1 | 6/2003 | Tolmachev et al. |
| 2003/0141820 A1 | 7/2003 | White et al. |
| 2003/0228772 A1 | 12/2003 | Cowans |
| 2003/0232138 A1 | 12/2003 | Tuominen et al. |
| 2004/0013577 A1 | 1/2004 | Ganguli et al. |
| 2004/0023516 A1* | 2/2004 | Londergan et al. ........... 438/785 |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1* | 11/2004 | Verghese et al. ............. 118/715 |

(56) References Cited

U.S. PATENT DOCUMENTS

| | | |
|---|---|---|
| 2004/0266011 A1* | 12/2004 | Lee et al. .................. 436/5 |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0110069 A1 | 5/2005 | Kil et al. |
| 2005/0173003 A1 | 8/2005 | Laverdiere et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0022954 A1 | 2/2007 | Iizuka et al. |
| 2007/0028842 A1 | 2/2007 | Inagawa et al. |
| 2007/0031599 A1 | 2/2007 | Gschwandtner et al. |
| 2007/0037412 A1 | 2/2007 | Dip et al. |
| 2007/0042117 A1 | 2/2007 | Kuppurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0124610 A1 | 5/2010 | Aikawa et al. |
| 2010/0130017 A1 | 5/2010 | Luo et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzuki et al. |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0014644 A1 | 1/2014 | Akiba et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |

(56) References Cited

U.S. PATENT DOCUMENTS

| | | |
|---|---|---|
| 2014/0251953 A1 | 9/2014 | Winkler et al. |
| 2014/0251954 A1 | 9/2014 | Winkler et al. |
| 2014/0346650 A1 | 11/2014 | Raisanen et al. |

FOREIGN PATENT DOCUMENTS

| | | |
|---|---|---|
| CN | 101423937 | 9/2011 |
| JP | 07283149 | 10/1995 |
| JP | 08335558 | 12/1996 |
| JP | 2001342570 | 12/2001 |
| JP | 2004014952 | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | 200701301 | 1/2007 |
| WO | 2006/056091 | 6/2006 |
| WO | 2006/078666 | 7/2006 |

OTHER PUBLICATIONS

USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
USPTO; Restriction Requirement dated May 8, 2014 in U.S. Appl. No. 13/791,246.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Serial No. 201080015699.9.
Chinese Patent Office; Notice on the First Office Action dated May 24, 2013 in Serial No. 201080036764.6.
Chinese Patent Office; Notice on the Second Office Action dated Jan. 2, 2014 in in Serial No. 201080036764.6.
Japanese Patent Office; Office Action dated Jan. 25, 2014 in in Serial No. 2012-504786.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and HfOxNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.

(56) References Cited

OTHER PUBLICATIONS

USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTal-xN Alloys of Rocksalt Structure. Journal of Applied Physics, 110, pp. 043535-1-043535-6, (2011).

\* cited by examiner

METHOD AND SYSTEM TO REDUCE OUTGASSING IN A REACTION CHAMBER

FIELD OF INVENTION

The present disclosure generally relates to gas-phase reaction methods and systems. More particularly, the disclosure relates to methods and systems to reduce outgassing of materials in a gas-phase reaction chamber.

BACKGROUND OF THE DISCLOSURE

Electronic devices, such as semiconductor devices, and photonic devices, such as light emitting and solar devices, are often formed by, among other things, depositing thin films of materials onto a substrate. Techniques for depositing films include atomic layer deposition (ALD). ALD may be desirable for various applications, because ALD processes are self-limiting, allowing precise, conformal deposition of material onto a substrate.

Atomic layer deposition typically includes gas-phase deposition of a film using two or more precursors, wherein one or more of the precursors may be activated, using, for example, a direct or remote plasma. A typical ALD process includes deposition using two precursors. In this case, a sequence often includes exposing a surface of a substrate to a first precursor to react with species on the surface of the substrate in a reaction chamber, purging the reaction chamber to remove the first precursor, exposing the surface of the substrate to a second precursor to react with species from the first precursor in the reaction chamber, and removing the second precursor from the reaction chamber. If each precursor is not sufficiently purged prior to the introduction of the other precursor into the reaction chamber, undesired gas-phase reactions may occur, which may, in turn, cause undesired particle formation or non-uniformity of the deposited film. Additionally or alternatively, insufficient purging of a precursor can result in depletion of a subsequently-introduced precursor.

During an ALD deposition process, one or more of the precursors may adsorb onto or be absorbed into a film formed on a surface of the reaction chamber and subsequently outgas during a cycle in which the other precursor is introduced into the reaction chamber. In this case, undesired gas-phase reactions may occur as one precursor outgasses as the other flows through the reaction chamber.

By way of example, when ALD is used to form a metal oxide film on a surface of a substrate, a method to form the metal oxide film may include exposing the substrate surface to a metal-containing precursor to react with chemical species on the substrate surface, purging the reaction chamber, exposing the substrate surface to an oxidant, such as oxygen, activated oxygen, ozone, water, or alcohol, and then purging the reaction chamber. These steps are repeated until a desired amount of the metal oxide is formed on the surface of the substrate. During these steps, the metal oxide film material is also deposited onto surfaces on the reaction chamber—in addition to the substrate surface. If the oxidant is absorbed into or adsorbed onto the material deposited onto the surface of a reaction chamber, the oxidant may not be completely purged from the reaction chamber during a purge step, and may therefore outgas during a subsequent step of exposing the substrate surface to a metal-containing precursor. As the oxidant outgasses, it may react with the metal-containing precursor during the step of exposing the substrate surface to a metal-containing precursor, resulting in undesired non-uniformity of the film across the substrate surface and/or particle formation within the reaction chamber.

To mitigate the outgassing of a precursor, the ALD process may be run at a relatively low pressure—e.g., less than 0.01 Torr—to enhance purging of the precursors. However, reducing the operating pressure of the reaction chamber to such low pressures generally decreases the throughput of the ALD process, and thus systems and methods operating at these pressures are not well suited for production of devices. Accordingly, improved methods and systems for mitigating outgassing from a reaction chamber during gas-phase reactions are desired.

SUMMARY OF THE DISCLOSURE

Various embodiments of the present disclosure relate to methods and systems for mitigating outgassing of substances within a reaction chamber of a reactor. While the ways in which various embodiments of the disclosure address the drawbacks of the prior art methods and systems are discussed in more detail below, in general, the present disclosure provides systems and methods for providing a barrier layer, using a scavenging agent to react with one or more substances that might otherwise outgas, or otherwise blocking a substance within a reaction chamber to thereby mitigate or prevent outgassing of the substance(s) during subsequent processing within the reaction chamber.

In accordance with various embodiments of the disclosure, methods of reducing outgassing of a substance include the steps of providing a gas-phase reactor having a reaction chamber, forming a barrier layer on a surface within the reaction chamber, depositing material onto a surface of a substrate within the reaction chamber, and removing the substrate from the reaction chamber. The barrier layer may include, for example, a transition metal oxide (e.g., $TiO_2$, $Ta_2O_5$, $HfO_2$, or $Al_2O_3$ or $SiO_2$), a transition metal nitride (e.g., TiN), a transition metal oxynitride (e.g., TiON), and/or a transition metal carbide (e.g., TiC). A thickness of the barrier layer may vary according to application, and may be greater than one monolayer, greater than two monolayers, or between about one monolayer and about 50 Å, about 5 Å and about 20 Å, or about 10 Å and about 20 Å. In accordance with various aspects of these embodiments, the step of providing a gas-phase reactor comprises providing an atomic layer deposition (ALD) reactor. In accordance with further aspects, the step of depositing includes providing a first precursor to the reaction chamber, the first precursor reacting with a surface of the substrate to form a first surface species, purging the first precursor from the reaction chamber—e.g., using low pressure and/or a carrier gas, providing a second precursor to the reaction chamber to react with the first surface species to form a second surface species, and purging the second precursor from the reaction chamber. The methods may be particularly useful when the material deposited onto the substrate (and onto a surface within a reaction chamber) includes hygroscopic material, such as lanthanum oxide, magnesium oxide, barium oxide, strontium oxide, or other materials that tend to absorb or adsorb one or more of the precursors. Exemplary methods improve thickness uniformity of material deposited onto the substrate, increase a number of runs within the reaction chamber between cleaning cycles, and produce films of higher quality, compared to similar films produced without forming the barrier layer within the reaction chamber.

In accordance with additional embodiments of the disclosure, a system for depositing material onto a substrate and for mitigating outgassing of a substance within a reaction chamber includes a reactor, such as an ALD reactor, including a reaction chamber, a first precursor source fluidly coupled to the reaction chamber, a second precursor source fluidly coupled to the reaction chamber, a purge gas fluidly coupled to the reaction chamber, and a barrier layer precursor fluidly coupled to the reaction chamber. In accordance with exemplary aspects of these embodiments, the system is configured to form a barrier layer on a surface within the reaction chamber after a substrate is removed from the reaction chamber or before the substrate enters the reaction chamber. In accordance with further aspects, the barrier layer precursor may be selected from, for example, one or more of transition metal oxide precursors, transition metal nitride precursors, transition metal oxynitride precursors, transition metal carbide precursors, silicon oxide precursors, and aluminum oxide precursors.

In accordance with additional embodiments of the disclosure, methods of reducing outgassing of a substance within a reaction chamber include the steps of providing a gas-phase reactor having a reaction chamber, depositing material onto a surface of a substrate within the reaction chamber (and onto a surface within the reaction chamber), and providing a scavenging precursor to the reaction chamber to react with the material on a surface of the reaction chamber. In accordance with various aspects of these embodiments, the scavenging gas is or substantially is consumed or depleted prior to reaching the substrate or the substrate holder—e.g., using dose control. The scavenging precursor may be, for example, a metal halide or an organometallic compound, such as hafnium chloride, silicon chloride, zirconium chloride, or TMA. In accordance with exemplary aspects of these embodiments, the step of depositing material onto a surface includes providing a first precursor to the reaction chamber to react with a surface of the substrate to form a first surface species, purging the first precursor from the reaction chamber, providing a second precursor to the reaction chamber to react with the first surface species to form a second surface species and purging the second precursor. In these cases, the step of providing a scavenging precursor may occur after the step of providing a first precursor and/or before the step of purging the first precursor. Alternatively, the step of providing a scavenging precursor may occur after the step of purging the first precursor. A method may also include a step of purging the scavenging precursor—e.g., prior to the step of providing the second precursor. In accordance with various aspects of these embodiments, the methods may include a step of dose front monitoring, which allows tuning of a process to mitigate or prevent the scavenging precursor from reacting with a surface on the substrate. In other words, the method may be tuned to consume all or nearly all of the scavenging precursor upstream of the substrate.

In accordance with additional embodiments of the disclosure, a system for depositing material onto a substrate and for mitigating outgassing of a substance within a reaction chamber includes a reactor, such as an ALD reactor, including a reaction chamber, a first precursor source fluidly coupled to the reaction chamber, a second precursor source fluidly coupled to the reaction chamber, a purge gas fluidly coupled to the reaction chamber, and a scavenging precursor source fluidly coupled to the reaction chamber. In accordance with exemplary aspects of these embodiments, the reaction chamber is exposed to a first precursor, and after the reaction chamber is exposed to the first precursor, the reaction chamber is exposed to a scavenging precursor, and after the reaction chamber is exposed to the scavenging precursor, the reaction chamber is exposed to a second precursor. Systems in accordance with these embodiments may include dose front monitoring devices, such as one or more quartz crystal microbalances to tune the system, such that all or nearly all of the scavenging precursor is consumed upstream of the substrate.

Both the foregoing summary and the following detailed description are exemplary and explanatory only and are not restrictive of the disclosure or the claimed invention

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments of methods and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates to gas-phase reactors, systems and methods. More particularly, the disclosure relates to reactors, systems, and methods that mitigate outgassing of substances from an interior surface of a reaction chamber—e.g., mitigate outgassing from material deposited onto an interior surface of a reaction chamber.

Figure 1:
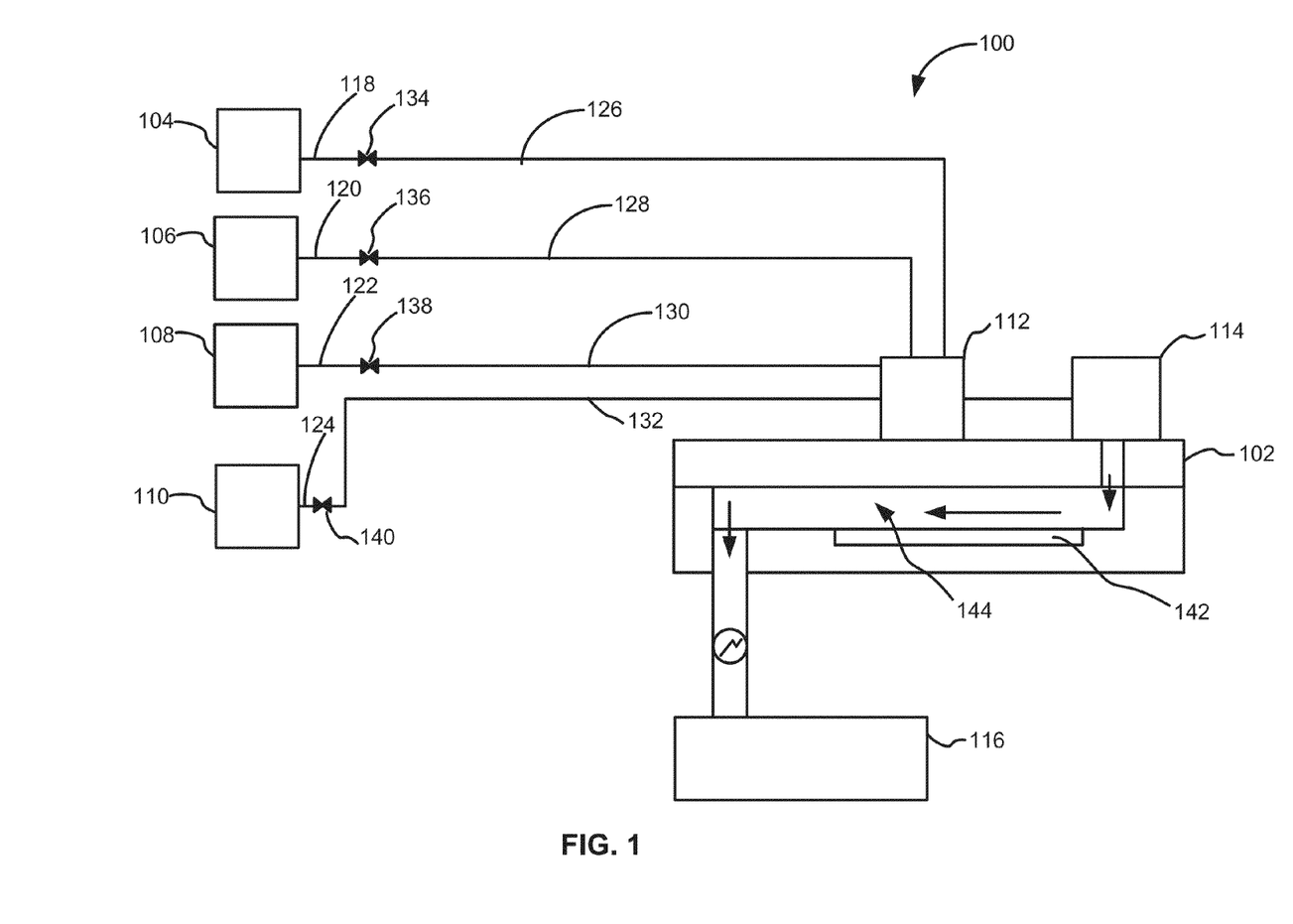
FIG. 1 illustrates a system for use in accordance with exemplary embodiments of the disclosure.

FIG. 1 illustrates a system 100, including a reactor 102. In the illustrated example, system 100 includes a first precursor source 104, a second precursor source 106, a barrier layer precursor source 108, a purge gas source 110, an optional mixer 112, an optional intake plenum 114, and a vacuum source 116. Sources 104-110 may be coupled to mixer 112 or reactor 102 using lines 118-132 and valves 134-140.

Reactor 102 may be a standalone reactor or part of a cluster tool. Further, reactor 102 may be dedicated to a particular process, such as a deposition process, or reactor 102 may be used for other processes—e.g., for layer passivation and/or etch processing. For example, reactor 102 may include a reactor typically used for atomic layer deposition (ALD) processing, such as a Pulsar 3000, available from ASM, and may include direct plasma, and/or remote plasma apparatus. Using a plasma may enhance the reactivity of one or more precursors. By way of one example, reactor 102 includes a reactor suitable for ALD deposition of a dielectric material onto a substrate 142. An exemplary ALD reactor suitable for system 100 is described in United States Patent Application Publication No. US 2012/0266821, the contents of which are hereby incorporated herein by reference, to the extent such contents do not conflict with the present disclosure. An operating pressure of a reaction chamber 144 of reactor 102 may vary in accordance with various factors. Reactor 102 may be configured to operate at near atmospheric pressure or at lower pressures. By way of examples, an operating pressure of reactor 102 during deposition and purge steps range from about 0.01 Torr to about 100 Torr or about 1 Torr to about 5 Torr.

Exemplary first precursors for precursor source 104 include, for example, one or more organometallic compounds or metal halide compounds. By way of examples, precursor source includes one or more compounds selected from the group consisting of hafnium chloride ($HfCl_4$) and trimethylaluminum (TMA).

Exemplary second precursors for precursor source 106 include oxidants, such as oxygen, activated oxygen, ozone, water, or alcohol. By way of particular examples, precursor source 106 includes water.

Exemplary precursors for barrier layer source 108 may include one or more precursors that react with adsorbed or absorbed material from source 104 and/or source 106 to form a less volatile compound. Suitable precursors for source 108 include transition metal oxide, transition metal nitride, transition metal oxynitride, and transition metal carbide material precursors. By way of examples, precursor source 108 includes a metal halide, such as $HfCl_4$.

Purge gas source 110 may include any suitable purge or carrier gas. Exemplary gasses include nitrogen, argon, helium, and hydrogen.

System 100 may include a gas distribution system. An exemplary gas distribution system, which allows for fast switching between gasses (e.g., from sources 104-110) is set forth U.S. Pat. No. 8,152,922 to Schmidt et al., issued Apr. 10, 2012, entitled "Gas Mixer and Manifold Assembly for ALD Reactor," the contents of which are hereby incorporated herein by reference, to the extent the contents do not conflict with the present disclosure. The gas distribution system may be used to, for example, mix a precursor gas and a carrier gas (which may be the same or different from a purge gas from purge gas source 108) prior to the gasses reaching plenum 114 or reactor 102. Further, although illustrated with a horizontal flow across substrate 142 (in the direction of the arrows in FIG. 1) reactors in accordance with alternative embodiments may include a vertical flow, for example, flow emanating from a showerhead and flowing substantially downward onto a substrate.

An exemplary ALD deposition process using a system, such as system 100, includes exposing a surface of substrate 142 within reaction chamber 144 of reactor 102 to a first precursor (e.g., an organometallic compound or a metal halide compound from source 104) that reacts with a species on a surface of substrate 142 to form a first surface species, purging the first precursor (e.g., using a purge gas from source 110), exposing the first surface species to a second precursor (e.g., an oxidant, such as water, from source 106) to form a second surface species, and purging the second precursor from the reaction chamber. Alternatively, an exemplary ALD sequences may begin with exposure to an oxidant, followed by a purge, which is followed by exposure to a second precursor, which is followed by a purge. In the system illustrated in FIG. 1, a precursor gas may be mixed with a carrier gas, such as a purge gas from source 110, at mixer 112, and the mixture of the precursor and the carrier can be introduced into reaction chamber 144 using plenum 114. The direction of the flow of the precursor and purge gas is generally indicated by the arrows in FIG. 1.

Several films formed using this technique may adsorb or absorb a precursor (e.g., from source 104 or 106) that may then outgas as the film is exposed to the other precursor. For example, a film such as lanthanum oxide, magnesium oxide, barium oxide, and strontium oxide may be hygroscopic. In this case, if water is used as an oxidant, the water may be absorbed by the deposited film and may not adequately be purged during a purge cycle. The water may therefore outgas during a step of exposing a substrate to another precursor. When this undesired outgassing of a precursor occurs as the film is exposed another other precursor, high particle counts and reduced uniformity of film deposited onto the substrate may result.

Figure 2:
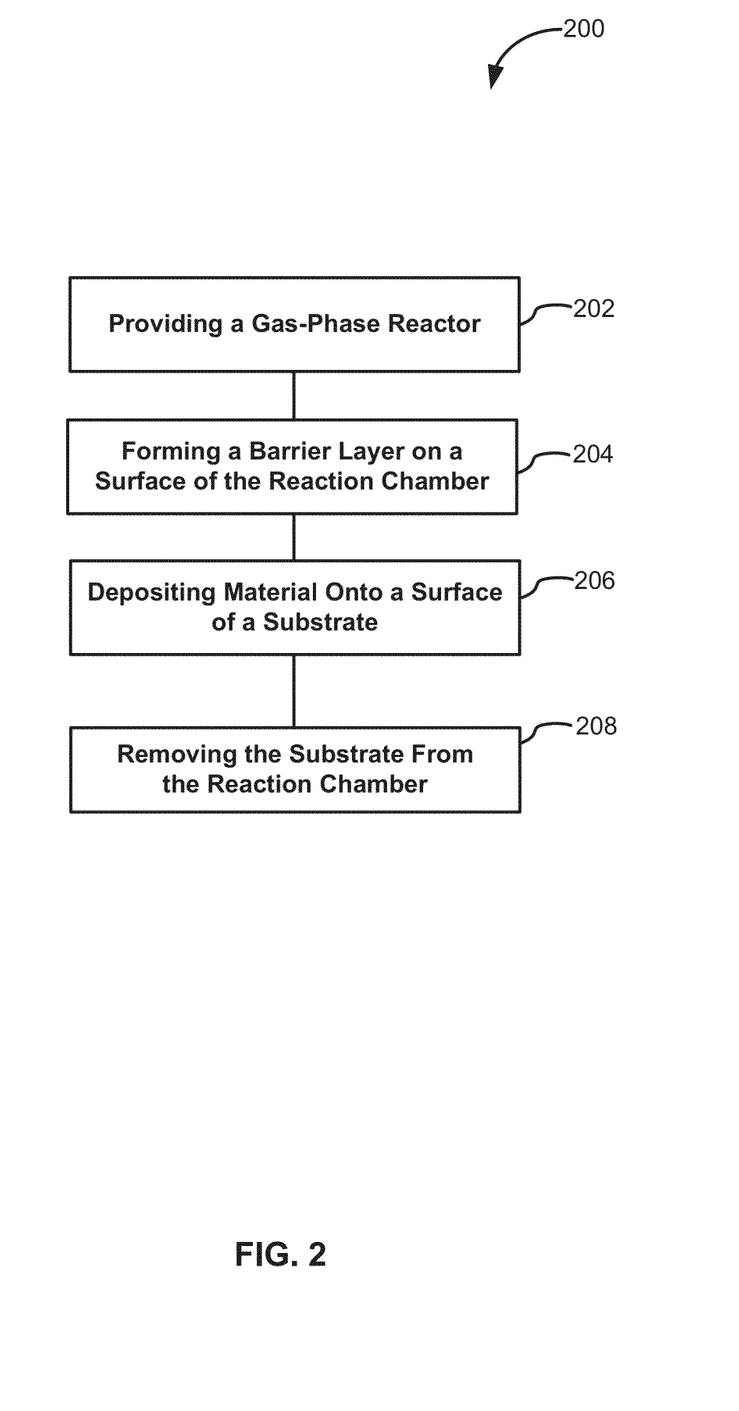
FIG. 2 illustrates a method for reducing outgassing of a substance in accordance with exemplary embodiments of the disclosure.

FIG. 2 illustrates a method 200 of reducing outgassing of a substance. Method 200 includes the steps of providing a gas-phase reactor having a reaction chamber (step 202), forming a barrier layer on a surface of the reaction chamber to mitigate outgassing of one or more gasses (step 204), depositing material onto a surface of a substrate within the reaction chamber (step 206), and removing the substrate from the reaction chamber (step 208). In accordance with exemplary aspects of these embodiments, the method produces films having relatively low particle counts—e.g., less than 10 particles having a size of greater than 32 nm on a 300 mm substrate. Additionally or alternatively, the method produces films having non-uniformity values of less than one percent one sigma.

Step 202 includes providing a gas-phase reactor, such as reactor 102 of system 100. As noted above, the reactor may include an ALD reactor, such as a horizontal flow reactor. The reactor may operate at a pressure of about 0.01 Torr to about 100 Torr or about 1 Torr to about 5 Torr and a temperature of about 100° C. to about 600° C. or about 200° C. to about 350° C.

To mitigate undesired outgassing of a substance, such as a first precursor or a second precursor that may be absorbed by or adsorbed onto material deposited onto an interior surface of a reaction chamber, a barrier layer is deposited onto the wetted surfaces or portions thereof within the reactor during step 204. As used herein, wetted surfaces of the reactor refer to surfaces within the reactor that are exposed to the deposition gasses, such as precursors from sources 104 and 106. Exemplary barrier layers include transition metal oxides, nitrides, oxynitrides, and carbides, as well as silicon oxide and aluminum oxide. By way of particular examples, the barrier layer includes material selected from one or more of $TiO_2$, TiN, TiON, TiC, $Ta_2O_5$, $HfO_2$, $SiO_2$, and $Al_2O_3$. In accordance with exemplary aspects of these embodiments, a barrier layer is formed by reacting a precursor (e.g., from source 108) with a species (e.g., an oxidant) to form the barrier layer.

A thickness of a barrier layer deposited during step 204 may vary in accordance with, for example, the material deposited onto a surface of a substrate, a thickness of the material deposited during step 204, a number of substrates processed during step 206, and the like. By way of examples, a thickness of the barrier layer may be greater than one monolayer, greater than two monolayers, or between about one monolayer and about 50 Å, about 5 Å to about 20 Å, or about 10 Å to about 20 Å.

During step 206, material is deposited onto a surface of a substrate, such as substrate 142. The surface of the substrate may have any suitable topography, including planar and/or non-planar surfaces that are exposed for deposition, and the substrate may include layers of various materials, such as materials used to form semiconductor and/or photonic devices. For example, a surface may include a top surface or a portion thereof (including topology) of a semiconductor or photonic device workpiece or wafer. Step 206 may suitably include depositing material using an ALD process. In this case, step 206 may include the substeps of providing a first precursor (e.g., from source 104) to the reaction chamber, the first precursor reacting with a surface of the substrate to form a first surface species, purging the first precursor from the reaction chamber (e.g., using a purge gas from source 110), providing a second precursor (e.g., from source 106) to the reaction chamber to react with the first surface species to form a second surface species, and purging the second precursor from the reaction chamber. These steps may be repeated a desired number of times until a desired or predetermined amount of material is formed on the surface of the substrate.

At step 208, the substrate is removed from the reaction chamber. By way of example, a substrate supported on a substrate support during step 204 can be removed from reaction chamber 144 of reactor 102 by moving the support to an unload position and then removing the substrate from the reactor. Although illustrated as process 200 progressing to step 208, material may be deposited onto multiple substrates, concurrently or sequentially during step 206 and removed from the reactor during step 208. Steps 204-208 may be repeated a desired number of times.

Figure 3:
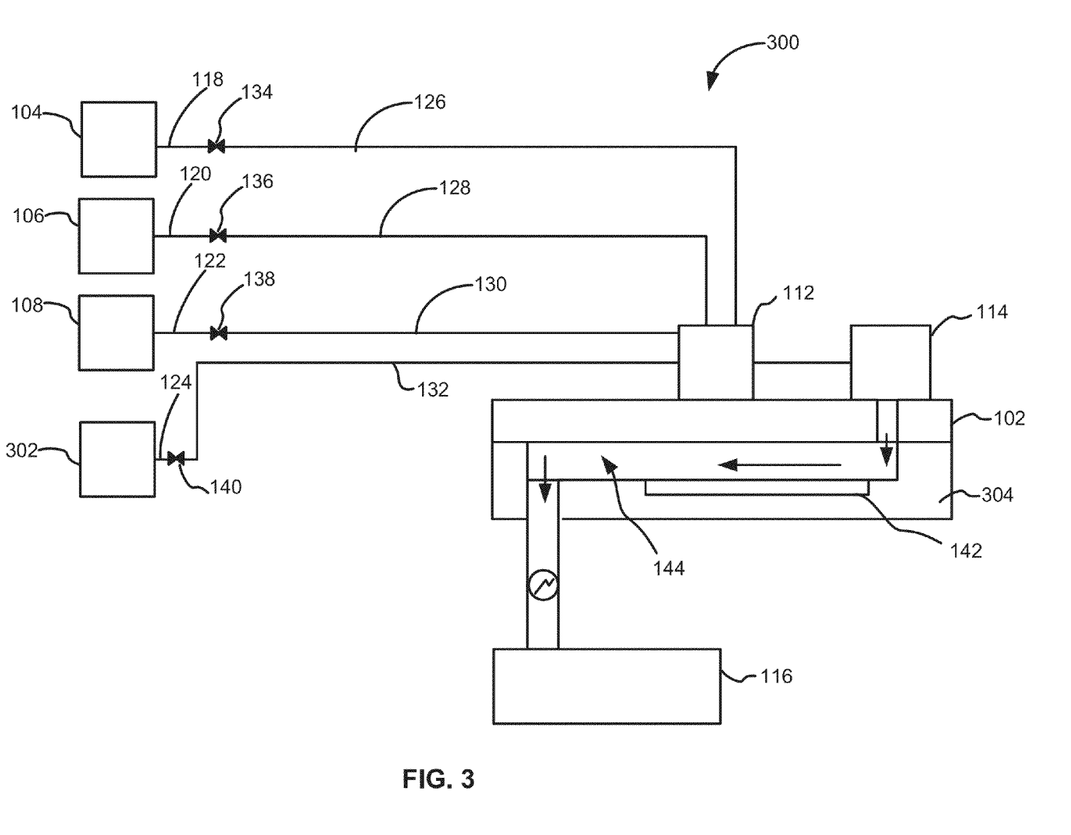
FIG. 3 illustrates another system in accordance with exemplary embodiments of the disclosure.

Turning now to FIG. 3, a system 300, in accordance with additional embodiments of the disclosure, is illustrated. System 300 is similar to system 100, except system 300 includes a scavenging precursor source 302 for providing a scavenging precursor to reaction chamber 144 of reactor 102.

Exemplary scavenging precursors suitable for use with exemplary embodiments of the disclosure include metal halides, such as metal chlorides, and organometallic compounds. By way of particular examples, scavenging precursor source 302 includes hafnium chloride or silicon chloride.

Figure 4:
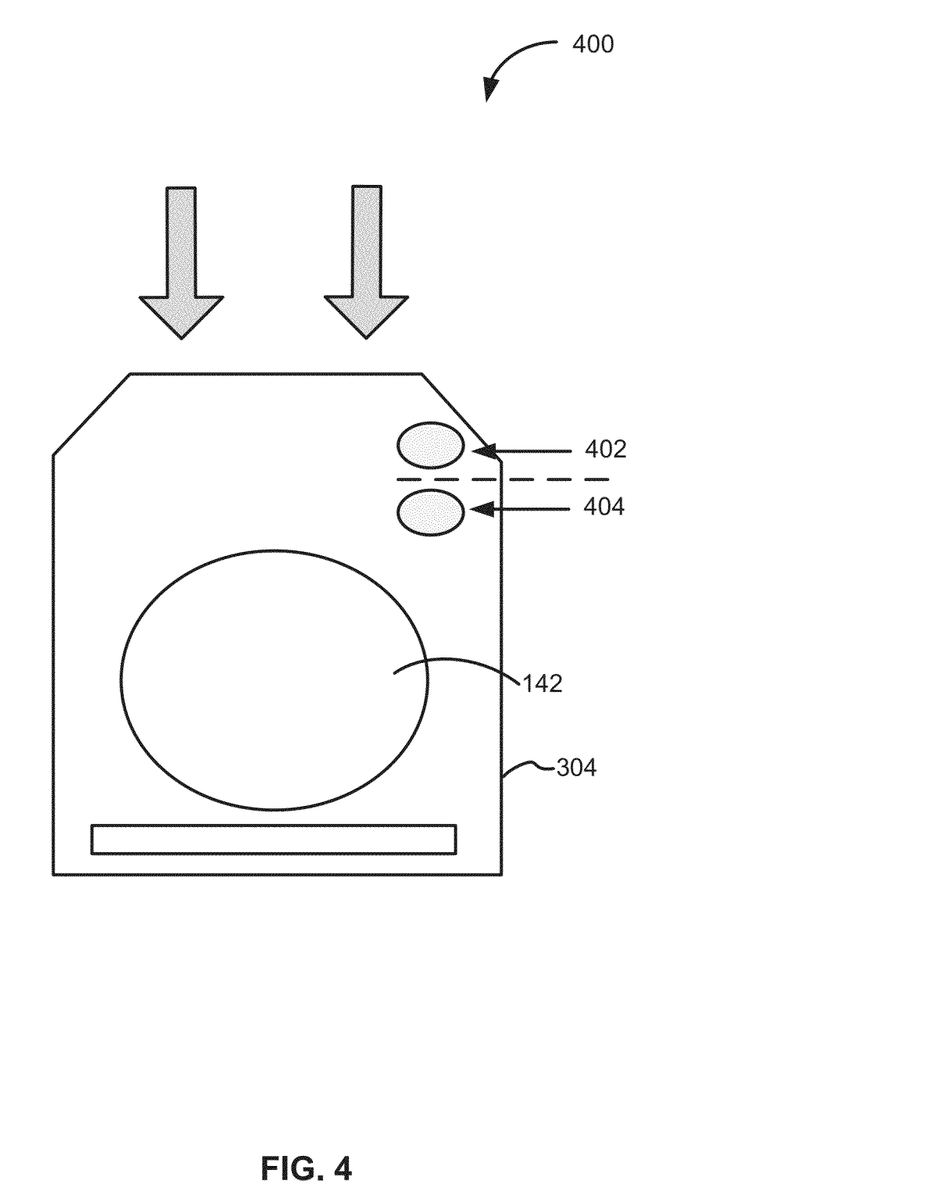
FIG. 4 illustrates a portion of a reaction chamber in accordance with exemplary embodiments of the disclosure.

Exemplary systems in accordance with various embodiments of the disclosure include one or more dose front monitoring devices to enable tuning of the system. FIG. 4 illustrates a portion 400 of an interior of a reaction chamber, such as chamber 144, which includes a first dose front monitoring device 402 and a second dose front monitoring device 404 located upstream of substrate 142 (or a location where substrate 142 would reside). Exemplary dose front monitoring devices include quartz crystal microbalances.

The dose front monitoring devices may be mounted onto a lower portion 304 of reactor 102 and within reaction chamber 144. The dose front monitoring devices may be used to tune process conditions, such that wetted surfaces of a reaction chamber that are upstream of the substrate can be exposed to the scavenging precursor, and all or nearly all of the scavenging precursor is consumed (e.g., reacts with) a species on the reaction chamber surface prior to reaching substrate 142. For example, the system may be tuned, such that a Stokes front of the scavenging precursor substantially falls to zero upstream of (e.g., near) substrate 142. This allows the scavenging precursor to be used during a deposition process, rather than removing a substrate prior to exposing the reaction chamber to the scavenging precursor.

Figure 5:
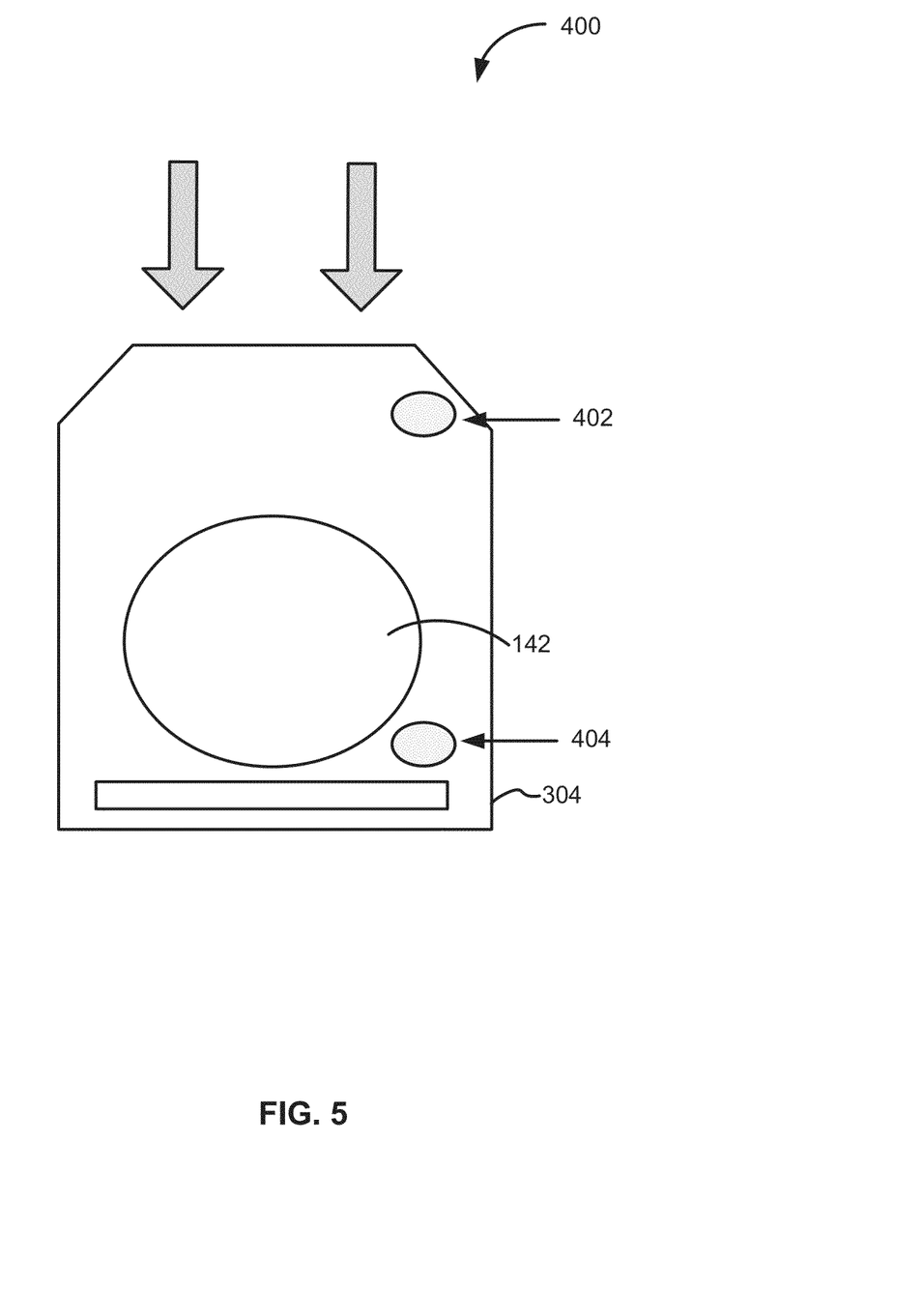
FIG. 5 illustrates another portion of a reaction chamber in accordance with further exemplary embodiments of the disclosure.

FIG. 5 illustrates another example of portion 400, in which the dose front monitors are located further apart. In the illustrated case, monitor 404 is located downstream of substrate 142. In this case, additional and/or more complex calculations may be required to tune the reactor, such that all or nearly all of the scavenging precursor is consumed prior to reaching substrate 142.

Figure 6:
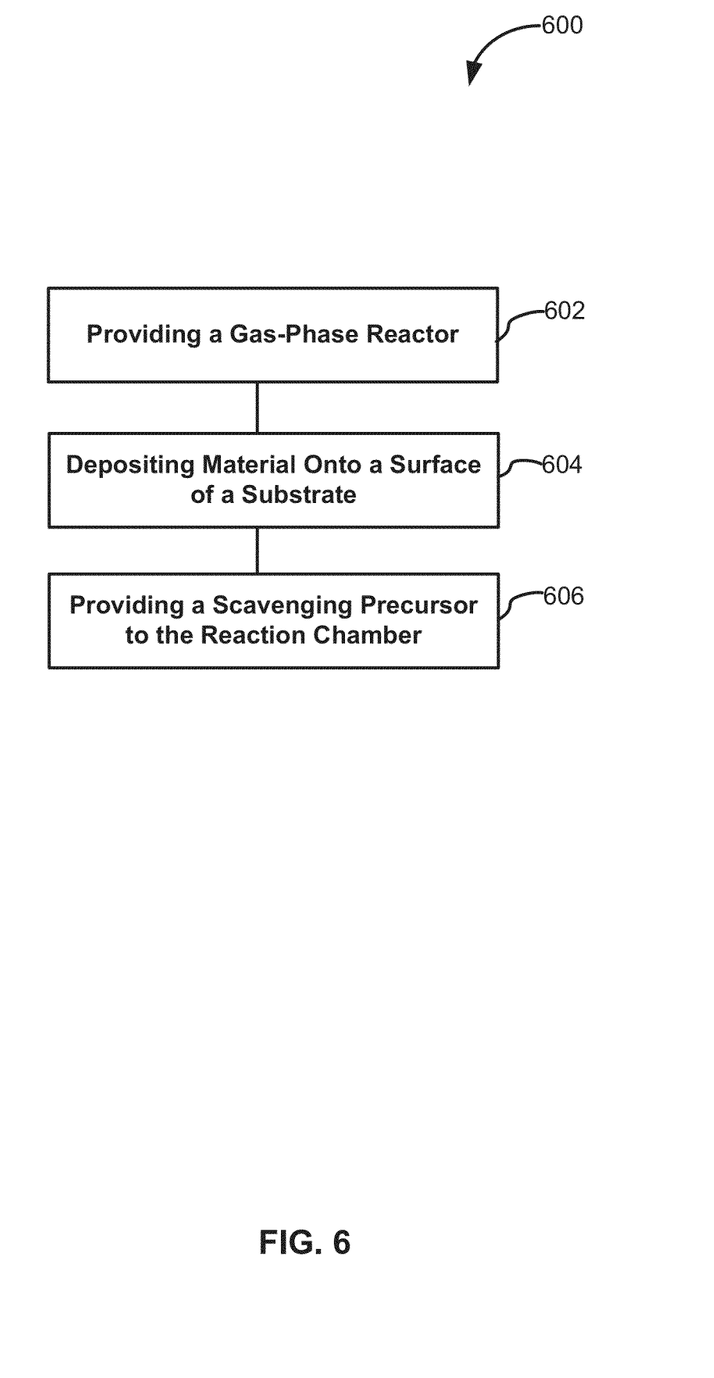
FIG. 6 illustrates another method for reducing outgassing of a substance in accordance with yet additional exemplary embodiments of the disclosure.

FIG. 6 illustrates a method 600 of reducing outgassing of a substance within a reaction chamber in accordance with additional exemplary embodiments of the disclosure. Method 600 includes the steps of providing a gas-phase reactor having a reaction chamber (step 602), depositing material onto a surface or a substrate within the reaction chamber (step 604), and providing a scavenging precursor to the reaction chamber to react with the material on a surface of the reaction chamber (step 606).

Providing a gas-phase reactor step 602 may include providing any suitable reactor, such as the reactors disclosed herein. In accordance with various examples, step 602 includes providing an ALD reactor.

During step 604, material may be deposited using, for example, an ALD process. In this case, step 604 may include providing a first precursor to the reaction chamber to react with a surface of the substrate to form a first surface species, purging the first precursor from the reaction chamber, providing a second precursor to the reaction chamber to react with the first surface species to form a second surface species, and purging the second precursor from the reaction chamber.

Figure 7:
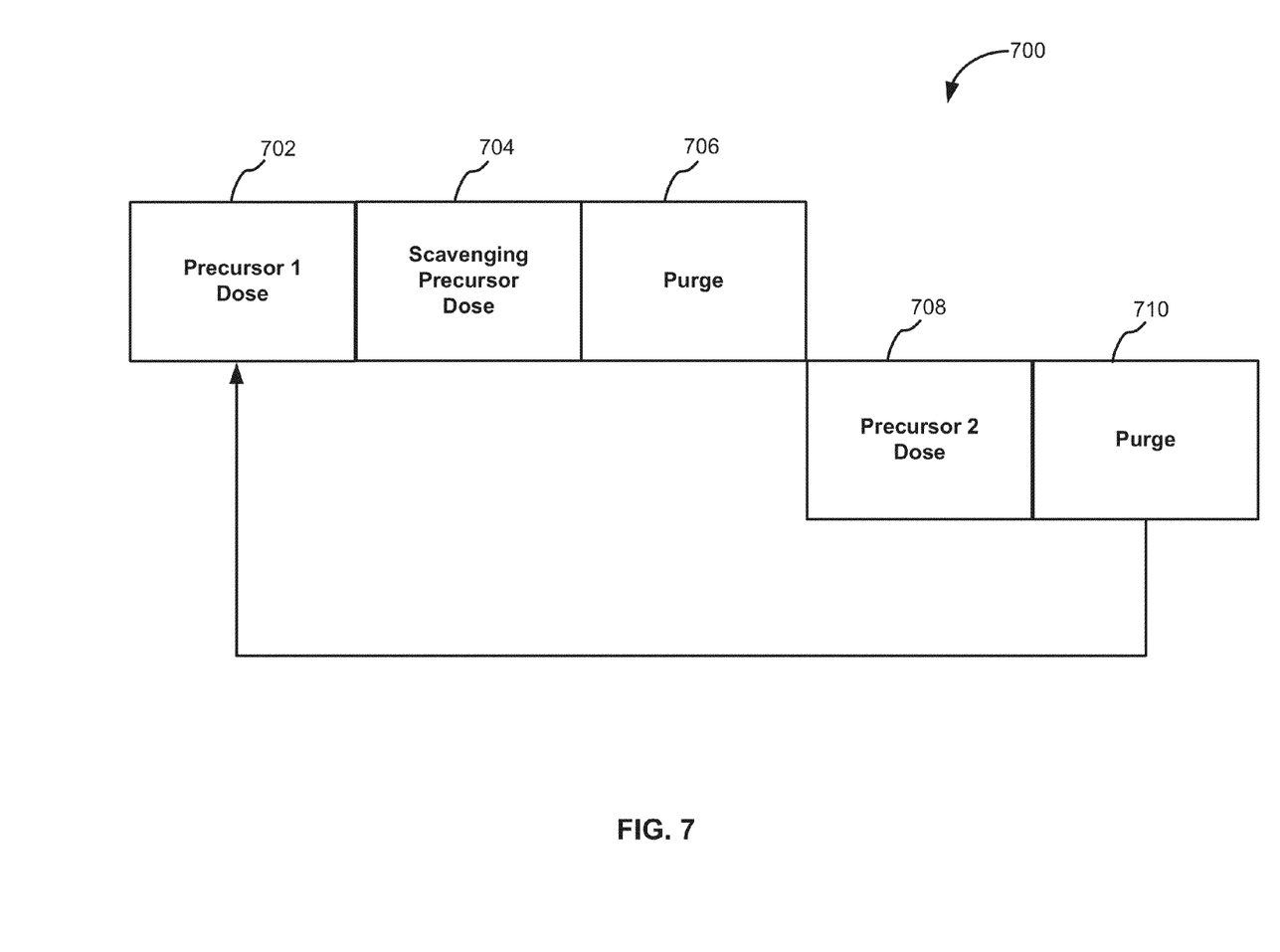
FIG. 7 illustrates a process in accordance with yet further exemplary embodiments of the disclosure.

Although illustrated as separate steps 604, 606, portions of steps 604 and 606 may overlap. FIG. 7 illustrates a process 700, which includes an exemplary combination of steps 604 and 606.

In the illustrated example, process 700 includes providing a first precursor to the reaction chamber to react with a surface of a substrate to form a first surface species (step 702), providing a scavenging precursor to the reaction chamber to react with the material on a surface of the reaction chamber—e.g., upstream of the substrate (step 704), purging the first precursor and the scavenging precursor from the reaction chamber (step 706), providing a second precursor to the reaction chamber to react with the first surface species to form a second surface species (step 708), and purging the second precursor from the reaction chamber (step 710). Step 704 may include providing the scavenging precursor, such that all or nearly all of the scavenging precursor is consumed prior to reaching the substrate. Process 700 may be repeated a desired number of times until a desired thickness of material is formed on a substrate. And, the precursors and purge gasses used for this process may include any of the precursors and purge gases noted herein.

Figure 8:
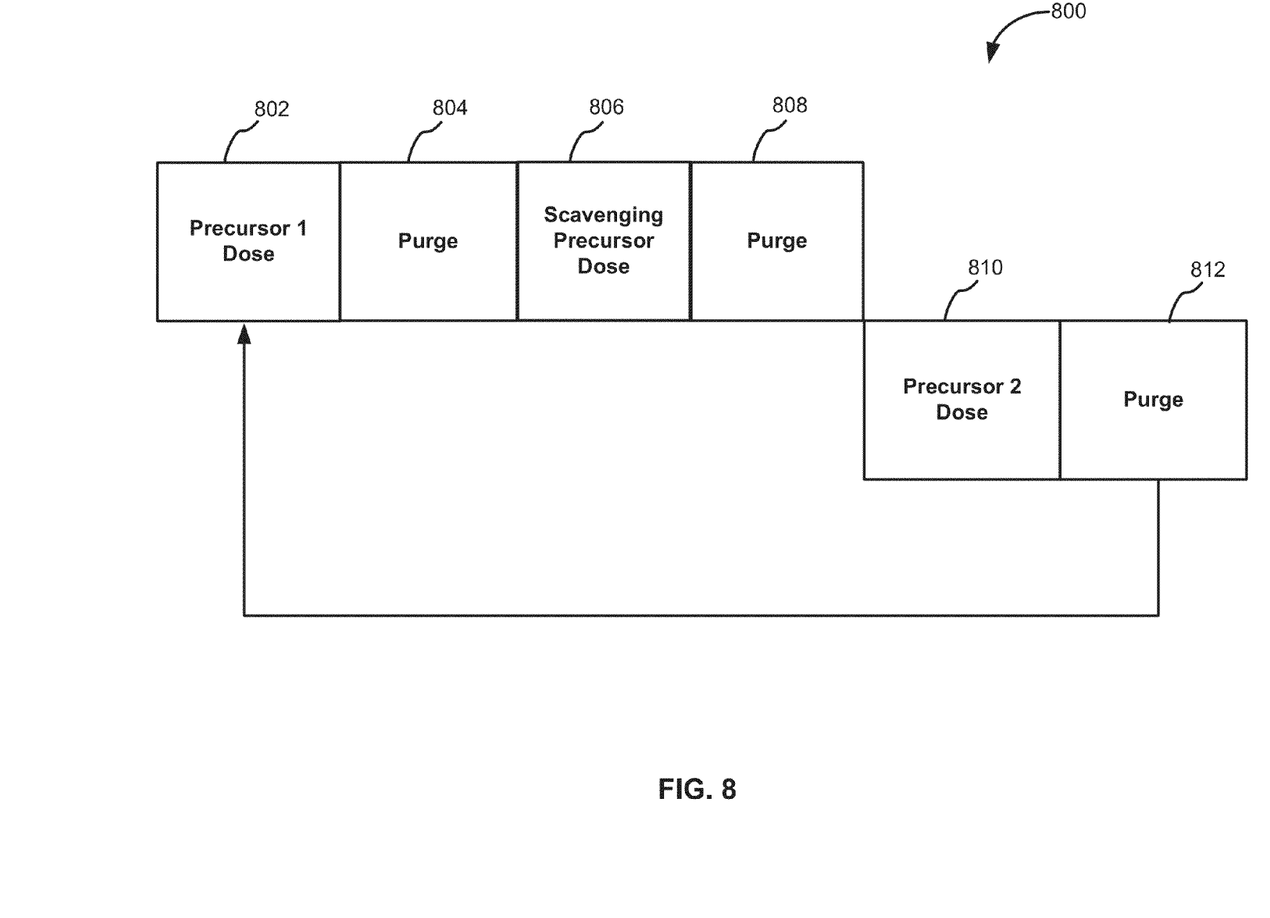
FIG. 8 illustrates another process in accordance with additional exemplary embodiments of the disclosure.

FIG. 8 illustrates another process 800, which includes an alternative exemplary combination of steps 604 and 606. Process 800 is similar to process 700, except process 800 includes an additional purge step 804. Steps 802, 806, 808, 810, and 812 may correspond to steps 702-710, respectively, of process 700, except step 808 may be shorter in duration and/or be at higher pressure, since less precursor material may be removed during this step, compared to step 706.

Although exemplary embodiments of the present disclosure are set forth herein, it should be appreciated that the disclosure is not so limited. For example, although the system and method are described in connection with various specific chemistries, the disclosure is not necessarily limited to these examples. Further, although methods are illustrated in a particular sequence, the method is not limited to such sequence of steps, unless indicated herein to the contrary. Various modifications, variations, and enhancements of the system and method set forth herein may be made without departing from the spirit and scope of the present disclosure.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method of reducing outgassing of a substance within a reaction chamber, the method comprising the steps of:
    providing a gas-phase reactor having a reaction chamber;
    depositing material onto a surface of a substrate within the reaction chamber; and
    providing a scavenging precursor to the reaction chamber to react with the material on a surface of the reaction chamber that is upstream of the substrate, wherein the scavenging precursor is substantially consumed or is consumed prior to reaching the substrate.

2. The method of claim 1, wherein the scavenging precursor is selected from the group consisting of metal halides and organometallic compounds.

3. The method of claim 1, wherein the scavenging precursor is selected from the group consisting of $HfCl_4$ and $SiCl_4$, and TMA.

4. The method of claim 1, wherein the step of depositing material onto a surface of a substrate comprises:
    providing a first precursor to the reaction chamber to react with a surface of the substrate to form a first surface species;
    purging the first precursor from the reaction chamber;
    providing a second precursor to the reaction chamber to react with the first surface species to form a second surface species; and
    purging the second precursor from the reaction chamber.

5. The method of claim 4, wherein the step of providing a scavenging precursor occurs after the step of providing a first precursor.

6. The method of claim 5, wherein the step of providing a scavenging precursor occurs before the step of purging the first precursor.

7. The method of claim 4, wherein the step of providing a scavenging precursor occurs after the step of purging the first precursor.

8. The method of claim 7, further comprising a step of purging the scavenging precursor.

9. The method of claim 8, wherein the step of purging the scavenging precursor occurs before the step of providing a second precursor.

10. The method of claim 1, further comprising a step of dose front monitoring to monitor dosing of the scavenging precursor at a front of the scavenging precursor flow.

11. The method of claim 10, wherein the step of dose front monitoring is used to tune process conditions to consume the scavenging precursor prior to the scavenging precursor reaching the substrate.

* * * * *